US012451887B2

(12) United States Patent
Yan et al.

(10) Patent No.: US 12,451,887 B2
(45) Date of Patent: Oct. 21, 2025

(54) DYNAMIC LATCH, SEMICONDUCTOR CHIP, COMPUTING POWER BOARD AND COMPUTING DEVICE

(71) Applicant: BITMAIN TECHNOLOGIES INC., Beijing (CN)

(72) Inventors: Hao Yan, Beijing (CN); Lei Wang, Beijing (CN); An Zhao, Beijing (CN)

(73) Assignee: BITMAIN TECHNOLOGIES INC., Beijing (CN)

( * ) Notice: Subject to any disclaimer, the term of this patent is extended or adjusted under 35 U.S.C. 154(b) by 111 days.

(21) Appl. No.: 18/621,934

(22) Filed: Mar. 29, 2024

(65) Prior Publication Data
US 2024/0243746 A1     Jul. 18, 2024

Related U.S. Application Data

(63) Continuation of application No. PCT/CN2022/118829, filed on Sep. 14, 2022.

(30) Foreign Application Priority Data

Sep. 30, 2021    (CN) .......................... 202111163541.2

(51) Int. Cl.
*H03K 3/02* (2006.01)
*H03K 3/356* (2006.01)
(Continued)

(52) U.S. Cl.
CPC . *H03K 19/018528* (2013.01); *H03K 3/35613* (2013.01); *H03K 19/096* (2013.01)

(58) Field of Classification Search
CPC .......... H03K 3/02; H03K 3/353; H03K 3/356; H03K 3/356017; H03K 3/356052;
(Continued)

(56) References Cited

U.S. PATENT DOCUMENTS 11,916,074 B2 *   2/2024  Peng ................... H03K 17/6872
2024/0396534 A1*  11/2024  Gong ................. H03K 19/0016

FOREIGN PATENT DOCUMENTS

| CN | 110677141 A | 1/2020 |
| CN | 110912548 A | 3/2020 |
| WO | WO2020056685 A1 | 3/2020 |

OTHER PUBLICATIONS

International Search Report dated Nov. 18, 2022 for International Application No. PCT/CN2022/118829.

* cited by examiner

*Primary Examiner* — Long Nguyen

(57) ABSTRACT

Provided is a dynamic latch, including: a substrate; a data transmission unit, including a first transmission gate and a second transmission gate, in which an input end of the first transmission gate is connected to an input end of the second transmission gate, and an output end of the first transmission gate is connected to an output end of the second transmission gate; a data output unit, including a first inverter, in which an input end of the first inverter is connected to the output ends of the two transmission gates, a first region of the substrate is adjacent to a second region thereof and oxide diffusion regions in two regions are continuous, drain regions of the two transmission gates are respectively located on opposite sides in the first region, and source regions of the two transmission gates are located between the drain regions of the two transmission gates.

18 Claims, 9 Drawing Sheets

(51) Int. Cl.
*H03K 19/0185* (2006.01)
*H03K 19/096* (2006.01)

(58) Field of Classification Search
CPC ......... H03K 3/35606; H03K 3/356104; H03K 3/356121; H03K 3/35613; H03K 3/356139; H03K 3/356147; H03K 3/356156; H03K 3/356182; H03K 3/356191; H03K 19/02; H03K 19/094; H03K 19/096
See application file for complete search history.

US 12,451,887 B2

DYNAMIC LATCH, SEMICONDUCTOR CHIP, COMPUTING POWER BOARD AND COMPUTING DEVICE

CROSS-REFERENCE TO RELATED APPLICATIONS

This application is a continuation of International Application No. PCT/CN2022/118829, filed on Sep. 14, 2022, which claims priority to Chinese patent application No. 202111163541.2, filed to the China National Intellectual Property Administration on Sep. 30, 2021, and entitled "DYNAMIC LATCH, SEMICONDUCTOR CHIP, COMPUTING POWER BOARD AND COMPUTING DEVICE". The disclosures of the aforementioned applications are incorporated herein by reference in their entireties.

TECHNICAL FIELD

This application relates to the field of integrated circuit technology and, in particular, to a dynamic latch, a semiconductor chip, a computing power board, and a computing device.

BACKGROUND

At present, in the field of integrated circuit technology, semiconductor devices (such as semiconductor chips) may apply an implementation of a continuous oxide diffusion (CNOD) region, which means that, oxide diffusion (OD) regions of respective functional units in the semiconductor device are continuous.

A dynamic latch can be used as a register for digital signals, and therefore can be applied to the semiconductor device such as the semiconductor chip. However, under the implementation of the CNOD region mentioned above, there may be a leakage issue in the dynamic latch, leading to anomalies in the dynamic latch.

SUMMARY

Based on this, the present application provides a dynamic latch, a semiconductor chip, a computing power board, and a computing device, so as to solve a leakage issue of the dynamic latch.

In a first aspect, the present application provides a dynamic latch comprising:
  a substrate;
  a data transmission unit, which is located in a first region of the substrate and includes a first transmission gate and a second transmission gate, where an input end of the first transmission gate is connected to an input end of the second transmission gate, and an output end of the first transmission gate is connected to an output end of the second transmission gate;
  a data output unit, which is located in a second region of the substrate and includes a first inverter, where an input end of the first inverter is connected to output ends of the two transmission gates; the first region is adjacent to the second region, and oxide diffusion regions within the two regions are continuous;
  drain regions of the two transmission gates are respectively located on opposite sides within the first region, and source regions of the two transmission gates are located between the drain regions of the two transmission gates.

In a second aspect, the present application provides a semiconductor chip, including one or more dynamic latches as described above.

In a third aspect, the present application also provides a computing power board, where the computing power board includes one or more semiconductor chips as described above.

In a fourth aspect, the present application also provides a computing device, where the computing device includes a power board, a control board, a connection board, a heat sink, and multiple computing power boards as described above; where the power board is respectively connected to the control board, the connection board, the heat sink, and each of the computing power boards; and the control board is connected to the computing power boards through the connection board, and the heat sink is set close to the computing power boards.

The present application avoids a situation where transistor parasitization occurs in CNOD technology, eliminates a leakage issue caused by the parasitic transistor, and effectively protects data storage nodes by setting up two transmission gates, where the drain regions of the two transmission gates are located on opposite sides within the first region, and the source regions of the two transmission gates are located between the drain regions of the two transmission gates.

BRIEF DESCRIPTION OF DRAWINGS

In order to provide a clearer explanation of technical solutions of embodiments in the present application, a brief introduction will be made to accompanying drawings required in a description of the embodiments. It is evident that, the accompanying drawings in the following description are for some embodiments of the present application. For those skilled in the art, other accompanying drawings can be obtained based on these drawings without creative labor.

DESCRIPTION OF EMBODIMENTS

The following will provide a clear and comprehensive description for technical solutions in embodiments of the present application, in conjunction with accompanying drawings. Obviously, the described embodiments are a part of the embodiments of the present application, not all of them. All other embodiments obtained based on the embodiments in the present application by those of ordinary skills in the art without creative labor would fall within a protection scope of the present application.

It should be understood that, terms used in the specification of the present application here are only for a purpose of describing specific embodiments and are not intended to limit the present application. As used in the specification and accompanying claims of the present application, unless context clearly indicates otherwise, singular forms of "a", and "the" are intended to include plural forms.

It should also be understood that, the terms "first", "second", "third", "fourth" and the like (if any) in the specification, claims or the above accompanying drawings of the present application are used to distinguish similar objects, and are not necessarily used to describe a specific order or sequence, which cannot be understood as indicating or implying a relative importance of them or implying a quantity of indicated technical features.

It should also be further understood that, the terms "and/or" (if any) used in the specification and the accompanying claims of the present application refer to any combination of one or more of listed relative items and all possible combinations, and include these combinations.

Figure 1:
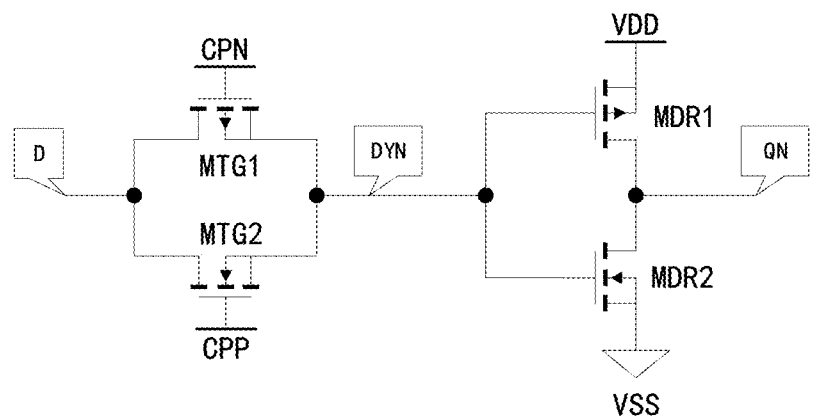
FIG. 1 is a circuit structure diagram of a dynamic latch in the prior art.

FIG. 1 is a circuit structure diagram of a dynamic latch in the prior art, and the dynamic latch includes a transmission gate and an inverter.

The transmission gate includes a PMOS transistor (i.e., MTG1 in the figure) and a NMOS transistor (i.e., MTG2 in the figure) connected in parallel. Specifically, drain of the PMOS transistor is connected to drain of the NMOS transistor, and a connection between the two drains serves as a data input node (i.e., D in the figure); source of the PMOS transistor is connected to source of the NMOS transistor, and a connection between the two sources serves as a data storage node (i.e., DYN in the figure); and gate of the PMOS transistor is connected to a clock signal (i.e., CPN in the figure), gate of the NMOS transistor is connected to a clock signal (i.e., CPP in the figure), and these two clock signals are signals in opposite phase to each other.

The inverter includes a PMOS transistor (i.e., MDR1 in the figure) and a NMOS transistor (i.e., MDR2 in the figure) connected in series. Specifically, both the gate of the PMOS transistor and the gate of the NMOS transistor are connected to the data storage node; the source of the PMOS transistor is connected to VDD (Voltage Drain Drain, voltage drain drain), the source of the NMOS transistor is connected to VSS (Voltage Source Source, voltage source source); and the drain of the PMOS transistor is connected to the drain of the NMOS transistor, and the connection between the two drains serves as a phase-inverted data output node (i.e., QN in the figure).

Based on the above dynamic latch, in a case where there is a data input at node D, when CPN is at a logic low level and CPP is at a logic high level, data in the node D is transmitted to QN node through DYN node for output; while when CPN is at the logic high level and CPP is at the logic low level, the DYN node is able to save current data, and transmit the saved data to the QN node for output, and this stage can be called as a data retention stage. Furthermore, it can be understood that, the data output in the QN node is in inverted phase to the data output in the DYN node.

Figure 2:
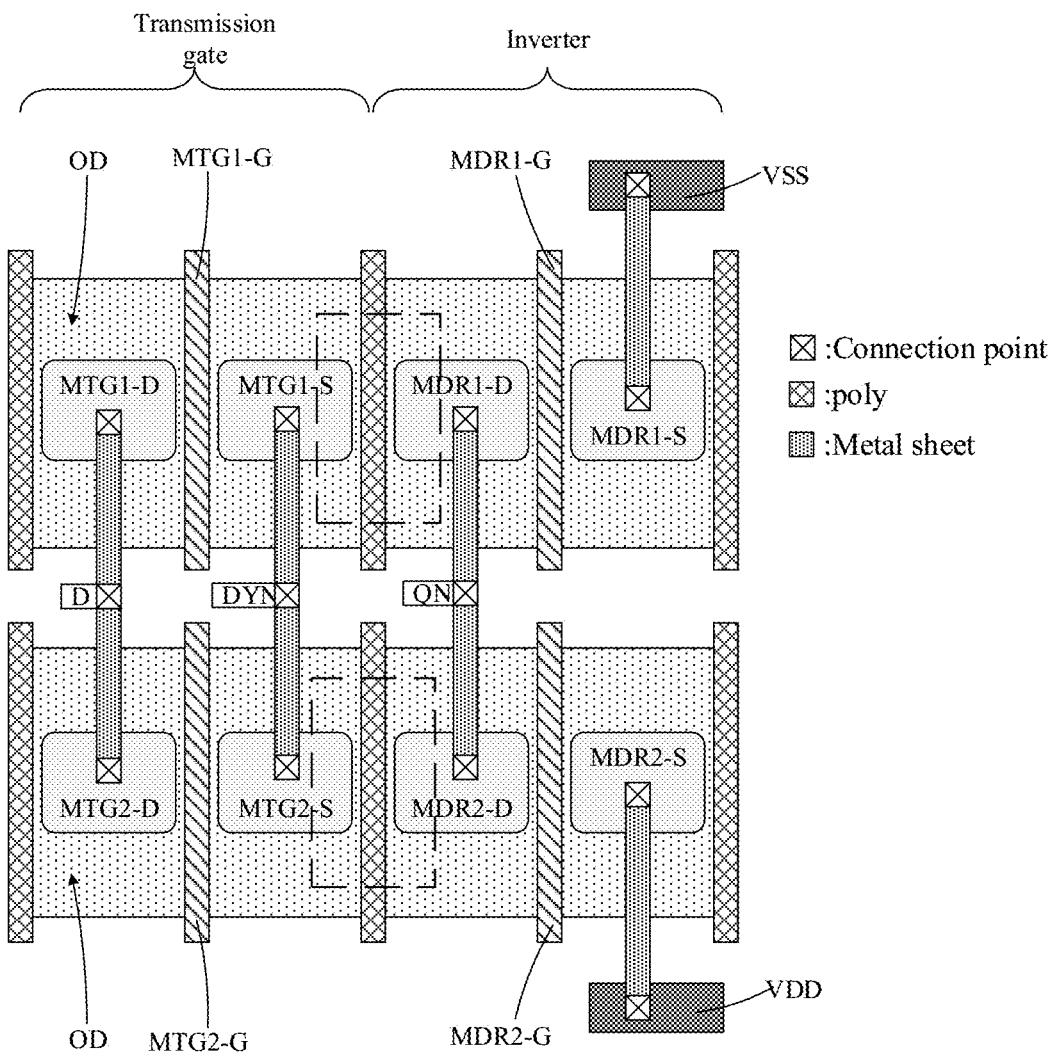
FIG. 2 is a structure diagram of a dynamic latch in the prior art.

As discussed earlier, the dynamic latch is commonly applied to semiconductor devices such as semiconductor chips, and current semiconductor devices often adopt an implementation of a CNOD region. Therefore, FIG. 2 is a structure diagram of a dynamic latch in the prior art. It should be noted that, MTG1-D in the figure represents a drain region of the PMOS transistor in the transmission gate, MTG1-S represents a source region of the PMOS transistor in the transmission gate, MTG1-G represents the gate of the PMOS transistor in the transmission gate, and other similar details will not be elaborated. It should still be noted that, parts of connection relationships are shown in the figure. For example, the drain of the PMOS transistor in the transmission gate is connected to the drain of the NMOS transistor in the transmission gate through a connection point and a metal sheet, and the connection of these two drains serves as a data input node D, and other similar details will not be elaborated. But not all connection relationships are shown in the figure.

As shown in the figure, two functional units (i.e., the transmission gate and the inverter) are located in two adjacent unit regions on a substrate (not shown), and ODs of these two unit regions are continuous; that is, the OD region corresponding to the PMOS transistor (i.e., the OD at the top of the figure) is continuous, and the OD region corresponding the NMOS transistor (i.e., the OD at the bottom of the figure) is also continuous. Due to an adoption of an implementation of the CNOD region, the functional units usually have pseudo polysilicon (i.e., poly in the figure) arranged on an OD region edge, that is, a poly on Oxide Diffusion Edge (PODE), and therefore PODE can also be understood as the pseudo gate.

Due to a fact that a parasitic transistor would occur on the PODE, there are two parasitic transistors in the dynamic latch, as shown in the dashed boxes in the figure. For ease of discussion, the parasitic transistor described here is referred to as MPODE in the present embodiment. Based on this, the inventors found that MPODE has a leakage issue. When the dynamic latch works in the data retention stage, the leakage of MPODE will affect the data retention node DYN, leading to anomalies in the dynamic latch.

Figure 3:
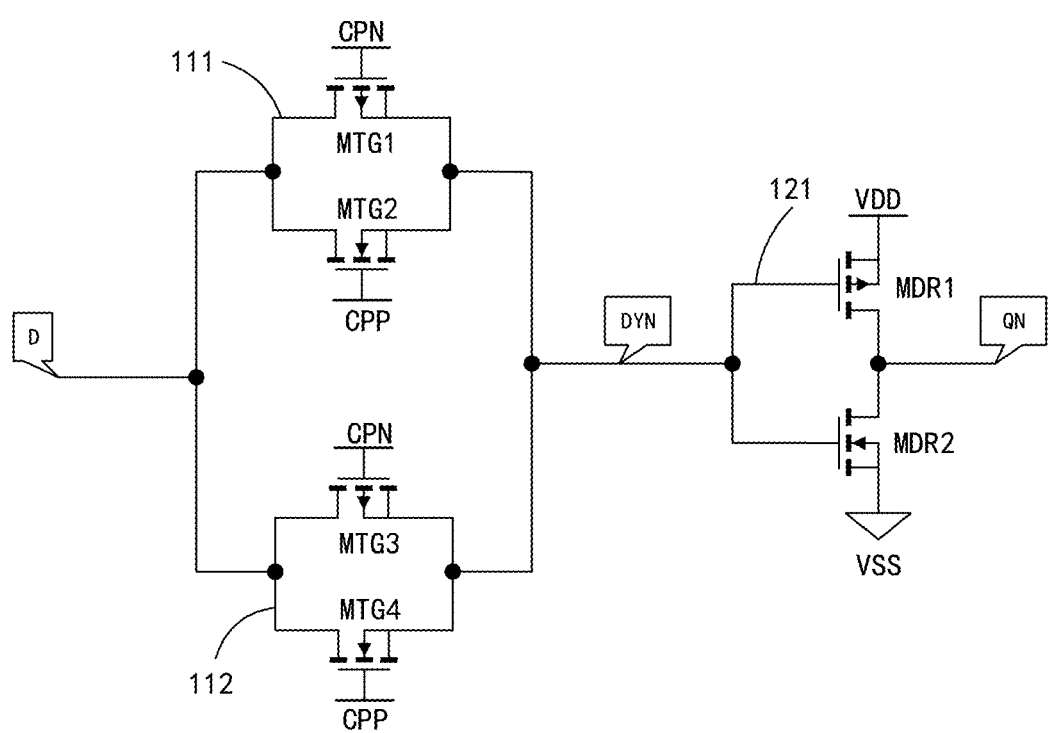
FIG. 3 is a circuit structure diagram of a dynamic latch provided by an embodiment of the present application.
Figure 4:
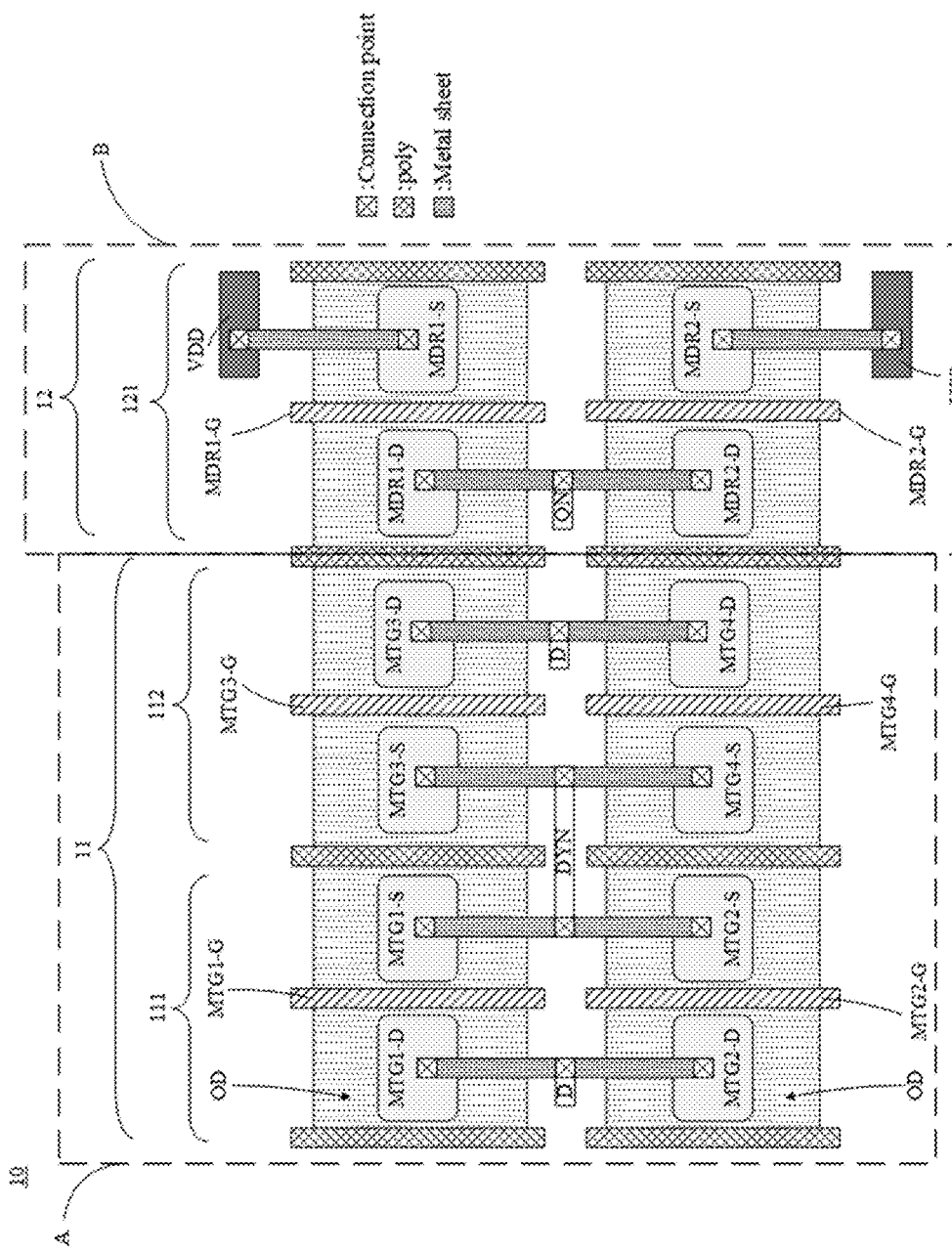
FIG. 4 is a structure diagram of a dynamic latch provided by an embodiment of the present application.

Therefore, please refer to FIGS. 3 and 4, where FIG. 3 is a circuit structure diagram of a dynamic latch 10 provided by an embodiment of the present application, and FIG. 4 is a structure diagram of the dynamic latch 10 provided by the embodiment of the present application. The dynamic latch 10 includes: a substrate (not shown in the figure); a data transmission unit 11 located in a first region A of the substrate. The data transmission unit 11 includes a first transmission gate 111 and a second transmission gate 112. An input end of the first transmission gate 111 is connected to an input end of the second transmission gate 112, and a data input interface is set for receiving input data. An output end of the first transmission gate 111 is connected to an output end of the second transmission gate 112. It can be understood that, the first transmission gate 111 and the second transmission gate 112 are connected in parallel.

It should be noted that, the input end of the first transmission gate 111 and the input end of the second transmission gate 112 can be connected to a same data input node D (connection relationships are not fully shown in FIG. 3), and the output end of the first transmission gate 111 and the output end of the second transmission gate 112 are connected to a same data storage node DYN.

The dynamic latch 10 also includes a data output unit 12 located in a second region B of the substrate, and the data output unit 12 includes a first inverter 121. The input end of the first inverter 121 is connected to the output ends of two transmission gates (the first transmission gate 111 and the second transmission gate 112), and the first region A is adjacent to the second region B, and oxide diffusion regions in the two regions are continuous.

For example, the first inverter 121 includes a PMOS transistor and an NMOS transistor. Specifically, source of the PMOS transistor (MDR1-S) and the source of the NMOS transistor (MDR2-S) form a source region of the first inverter 121, and the source of the PMOS transistor (MDR1-S) is connected to a voltage drain drain (VDD), and the source of the NMOS transistor (MDR2-S) is connected to a voltage source source (VSS). It can be understood that, a drain region of the first inverter 121 is formed in a same way as the source region, and the drain region of the first inverter 121 serves as the output end (QN node) of the first inverter 121, for outputting data.

The drain regions (MTG1-D, MTG2-D; MTG3-D, MTG4-D) of the two transmission gates in the data transmission unit 11 are respectively located on opposite sides in the first region A, and the source regions (MTG1-S, MTG2-S; MTG3-S, MTG4-S) of the two transmission gates are located between the drain regions (MTG1-D, MTG2-D; MTG3-D, MTG4-D) of the two transmission gates.

For example, data can be transmitted by using the first transmission gate 111 and the second transmission gate 112, and in a production of integrated circuits, if it is designed as shown in FIG. 3, influence of the parasitic transistor MPODE can be eliminated.

It can be understood that, the first transmission gate 111 includes the PMOS transistor and the NMOS transistor. The drain (MTG1-D) of the PMOS transistor is connected to the drain (MTG2-D) of the NMOS transistor, which can serve as the input end of the first transmission gate 111 and connect to the data input node D; the source (MTG1-S) of the PMOS transistor is connected to the source (MTG2-S) of the NMOS transistor, which can serve as the output end of the first transmission gate 111 and connect to the data storage node DYN. Similarly, a structure of the second transmission gate 112 is the same as that of the first transmission gate 111, and will not be elaborated repeatedly here.

In some embodiments, each of the two transmission gates includes a first clock signal input end and a second clock signal input end. The first clock signal input ends of the two transmission gates are connected to a same first clock signal, and the second clock signal input ends of the two transmission gates are connected to a same second clock signal. The first clock signal and the second clock signal are signals in opposite phase to each other.

For example, both the first transmission gate 111 and the second transmission gate 112 include the first clock signal input end and the second clock signal input end. Due to a fact that the first transmission gate 111 and the second transmission gate 112 are in a parallel relationship, the first clock signal input ends of the first transmission gate 111 and the second transmission gate 112 are connected to the same first clock signal CPN, and the second clock signal input ends of the first transmission gate 111 and the second transmission gate 112 are connected to the same second clock signal CPP.

It can be understood that, during a working process, data is input at the data input node D. If CPN received by the first clock signal input ends of the first transmission gate 111 and the second transmission gate 112 is at a logic low level, and CPP received by the second clock signal input ends is at a logic high level, the first transmission gate 111 and the second transmission gate 112 can simultaneously transmit data to the DYN node.

If CPN received by the first clock signal input ends of the first transmission gate 111 and the second transmission gate 112 is at the logic high level, and CPP received by the second clock signal input ends is at the logic low level, the first transmission gate 111 and the second transmission gate 112 will no longer transmit data, and the DYN node can store current data, thereby a data latch operation is implemented.

It can be understood that, the dynamic latch 10 can transmit and/or latch data in the data transmission unit 11; and as shown in FIG. 4, there are drain regions (MTG3-D, MTG4-D) of the second transmission gate 112 between the QN node and the DYN node. There is no parasitic transistor MOPDE between the drain region (MTG3-D, MTG4-D) of the second transmission gate 112 and the source region (MTG3-S, MTG4-S) of the second transmission gate 112. Therefore, the QN node will not affect the DYN node, and the parasitic transistors MOPDE will not parasitize near the DYN node, thereby avoiding the occurrence of the parasitic transistors during the production of the integrated circuits and eliminating impacts of the parasitic transistor MOPDE on the DYN node.

Figure 5:
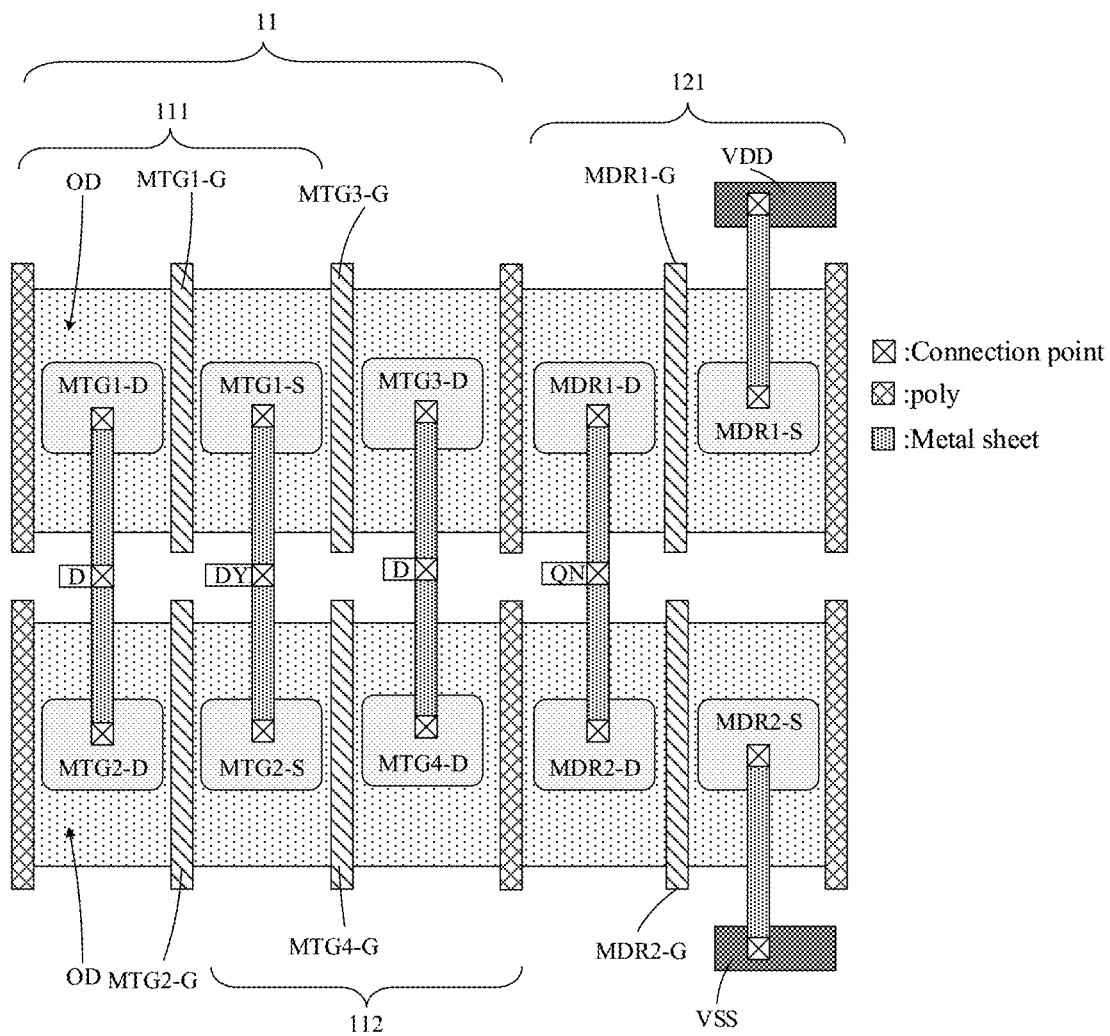
FIG. 5 is a structure diagram of a dynamic latch provided by another embodiment of the present application.

Please refer to FIG. 5 in combination with above embodiments, where FIG. 5 is a structure diagram of a dynamic latch 10 provided by another embodiment of the present application.

In some embodiments, the first transmission gate 111 and the second transmission gate 112 share one source region; and the shared source region is located between drain regions (MTG1-D, MTG2-D) of the first transmission gate 111 and the drain regions (MTG3-D, MTG4-D) of the second transmission gate 112.

For example, during a production process of integrated circuits, the smaller the size, the shorter the response time and the smaller the electronic device that the integrated circuit is able to be fit into, thus a structural size of the dynamic latch 10 can be reduced without changing its functionality, by means of the shared source region between the first transmission gate 111 and the second transmission gate 112.

It can be understood that, the source region shared by the first transmission gate 111 and the second transmission gate 112 that shown in FIG. 5 is the source region (MTG1-S, MTG2-S) of original first transmission gate 111. In other embodiments, the source region shared by the first transmission gate 111 and the second transmission gate 112 can be the source region (MTG3-S, MTG4-S in FIG. 3) of original second transmission gate 112. It can be understood that, both modes can achieve a same function and achieve a purpose of reducing the size of the dynamic latch 10. FIG. 5 is only the structure diagram of one embodiment of the present application and does not limit a specific implementation of the present application.

As shown in FIG. 5, in some embodiments, the drain regions (MDR1-D, MDR2-D) of the first inverter 121 are located on a side near the first region A within the second region B, and the source regions (MDR1-S, MDR2-S) of the first inverter 121 are located on the side far away from the first region A within the second region B.

For example, due to drain regions (MTG3-D, MTG4-D) of the second transmission gate 112 between the QN node and the DYN node, even if the QN node is located near the first region A, it will not leak electricity to the DYN node.

Figure 6:
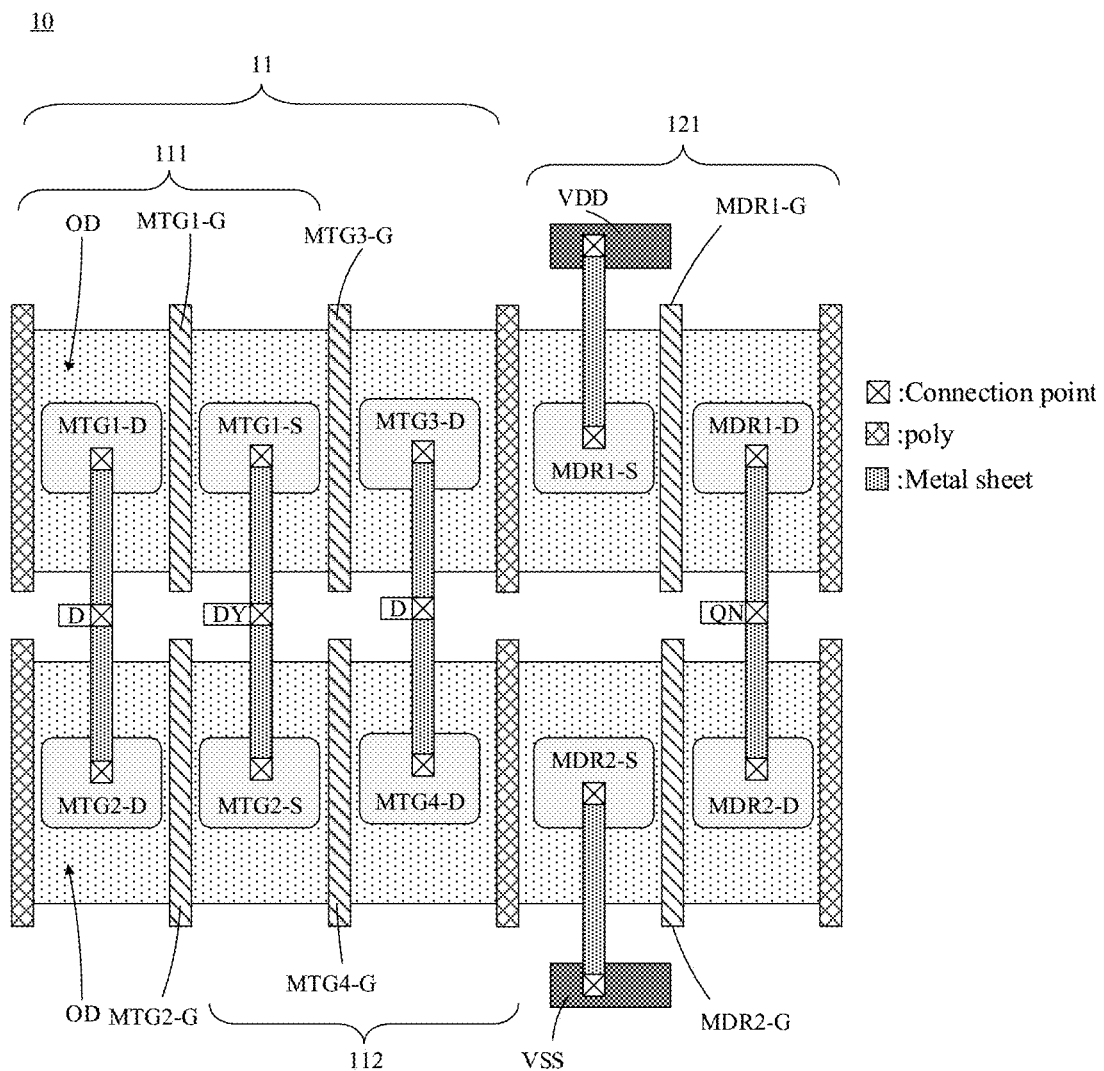
FIG. 6 is a structure diagram of a dynamic latch provided by another embodiment of the present application.

Please refer to FIG. 6 in combination with the aforementioned embodiments, and FIG. 6 is a structure diagram of a dynamic latch provided by another embodiment of the present application.

In some other implementations, positions of drain regions (MDR1-D, MDR2-D) of the first inverter 121 can be exchanged with the positions of source regions (MDR1-S, MDR2-S) of the first inverter 121. It can be understood that, the drain regions (MDR1-D, MDR2-D) of the first inverter 121 are located on a side far away from the first region A within the second region B, and the source regions (MDR1-S, MDR2-S) of the first inverter 121 are located on the side near the first region A within the second region B, thereby avoiding interference between the QN node and the D node, making the dynamic latch 10 work better.

It can be understood that, in the embodiment corresponding to FIG. 4, the drain regions (MDR1-D, MDR2-D) of the first inverter 121 can also be located on the side far away from the first region A within the second region B, and the source regions (MDR1-S, MDR2-S) of the first inverter 121 are located on the side near the first region A within the second region B, which will not be elaborated repeatedly here.

Figure 7:
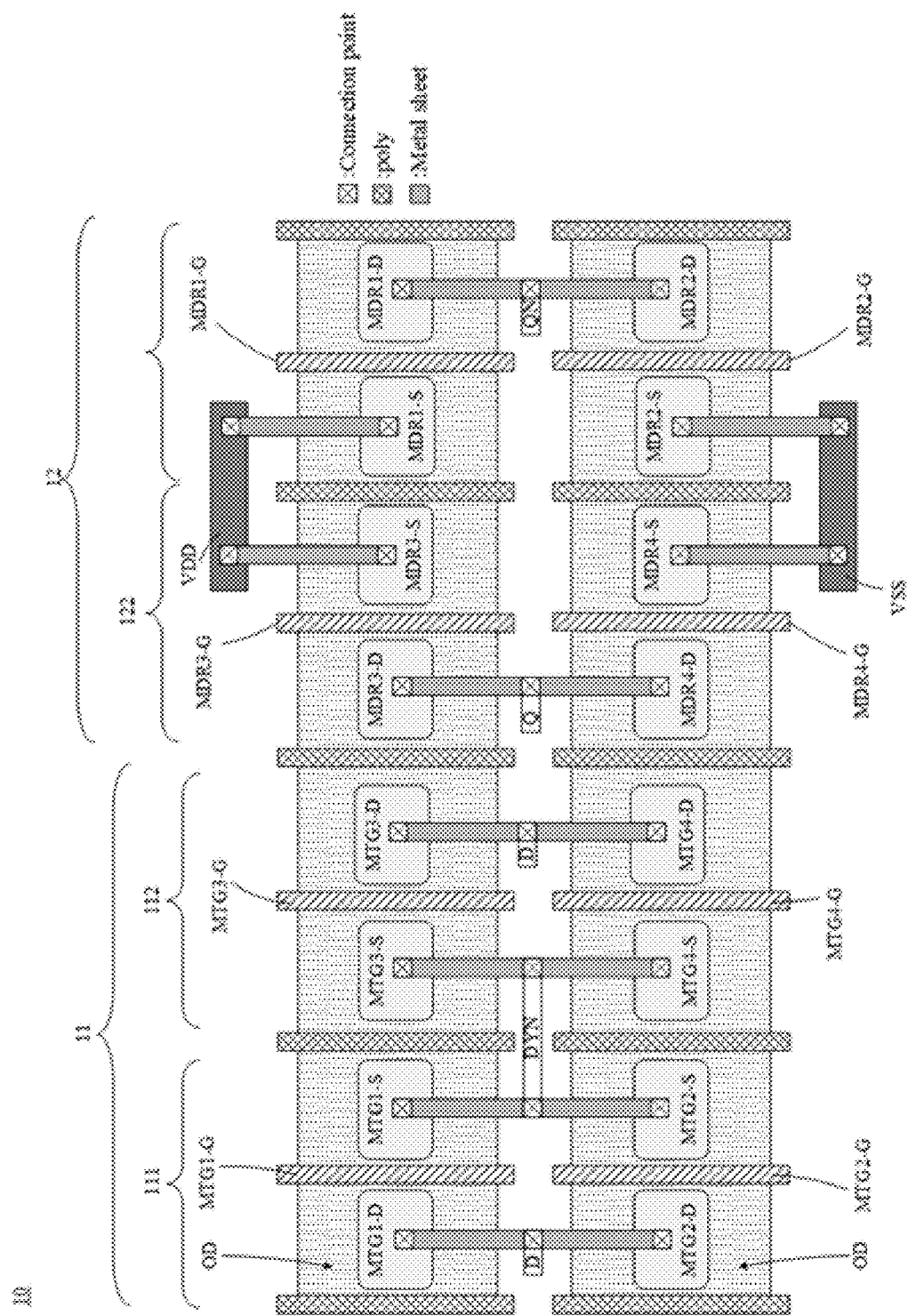
FIG. 7 is a structure diagram of a dynamic latch provided by yet another embodiment of the present application.

Please refer to FIG. 7 in combination with the above embodiments, and FIG. 7 is a structure diagram of a dynamic latch 10 provided by yet another embodiment of the present application.

In some embodiments, the data output unit 12 also includes a second inverter 122, where an input end of the second inverter 122 is connected to an output end of the first inverter 121.

It can be understood that, a connection between the input end of the second inverter 122 and the output end of the first inverter 121 is a circuit connection, and a corresponding connection relationship is not shown in FIG. 7.

For example, after output from the output end (QN node) of the first inverter 121, data enters the second inverter 122 for an inversion processing. The processed data can be locked in the output end (Q node) of the second inverter 122 or outputted through the output end (Q node). It can be understood that, the data output by the second inverter 122 is inverted from the data output by the first inverter 121. Based on this, the data of the output end (Q node) of the second inverter 122 is in phase with the data of the input end (D node) of the second transmission gate 112.

For example, the data in the DYN node is 1, when it is processed by the first inverter 121, data 0 will be output, and the output of the first inverter 121 is processed by the second inverter 122 to output data 1.

For example, by adding the second inverter 122 after the first inverter 121, the data output by the first inverter 121 can be inverted in phase, so as to meet specific usage requirements.

For example, the structure of the second inverter 122 is the same as that of the first inverter 121.

It can be understood that, in some embodiments, the first inverter 121 and the second inverter 122 can be set when two transmission gates share the source region. And in some other embodiments, the first inverter 121 and the second inverter 122 can also be set when two transmission gates do not share the source region.

In some embodiments, the drain regions (MDR3-D, MDR4-D; MDR1-D, MDR2-D) of the two inverters are respectively located on opposite sides of the second region B, and the source regions (MDR3-S, MDR4-S; MDR1-S, MDR2-S) of the two inverters are located between the drain regions (MDR3-D, MDR4-D; MDR1-D, MDR2-D) of the two inverters.

For example, the second inverter 122 may be located on a side near the first region A within the second region B, for example, between the data transmission unit 11 and the first inverter 121, to move the output end (QN node) of the first inverter 121 away from the data transmission unit 11.

In some embodiments, the source (MDR1-S) of the PMOS transistor in the first inverter 121 and the source (MDR3-S) of the PMOS transistor in the second inverter 122 are connected to same voltage drain drain (VDD); and the source (MDR2-S) of the NMOS transistor in the first inverter 121 and the source (MDR4-S) of the NMOS transistor in the second inverter 122 are connected to the same voltage source source (VSS).

For example, the source regions (MDR3-S, MDR4-S; MDR1-S, MDR2-S) of the two inverters are located between the drain regions (MDR3-D, MDR4-D; MDR1-D, MDR2-D) of the two inverters, making it easier to connect to the same voltage source source (VSS) and the same voltage drain drain (VDD).

It can be understood that, as shown in FIG. 7, the source (MDR1-S) of the PMOS transistor in the first inverter 121 and the source (MDR3-S) of the PMOS transistor in the second inverter 122 can be connected to the same voltage drain drain (VDD), and the source (MDR2-S) of the NMOS transistor in the first inverter 121 and the source (MDR4-S) of the NMOS transistor in the second inverter 122 are connected to the same voltage source source (VSS). Through above designs, a manufacturing difficulty of the dynamic latch 10 can be effectively reduced.

Figure 8:
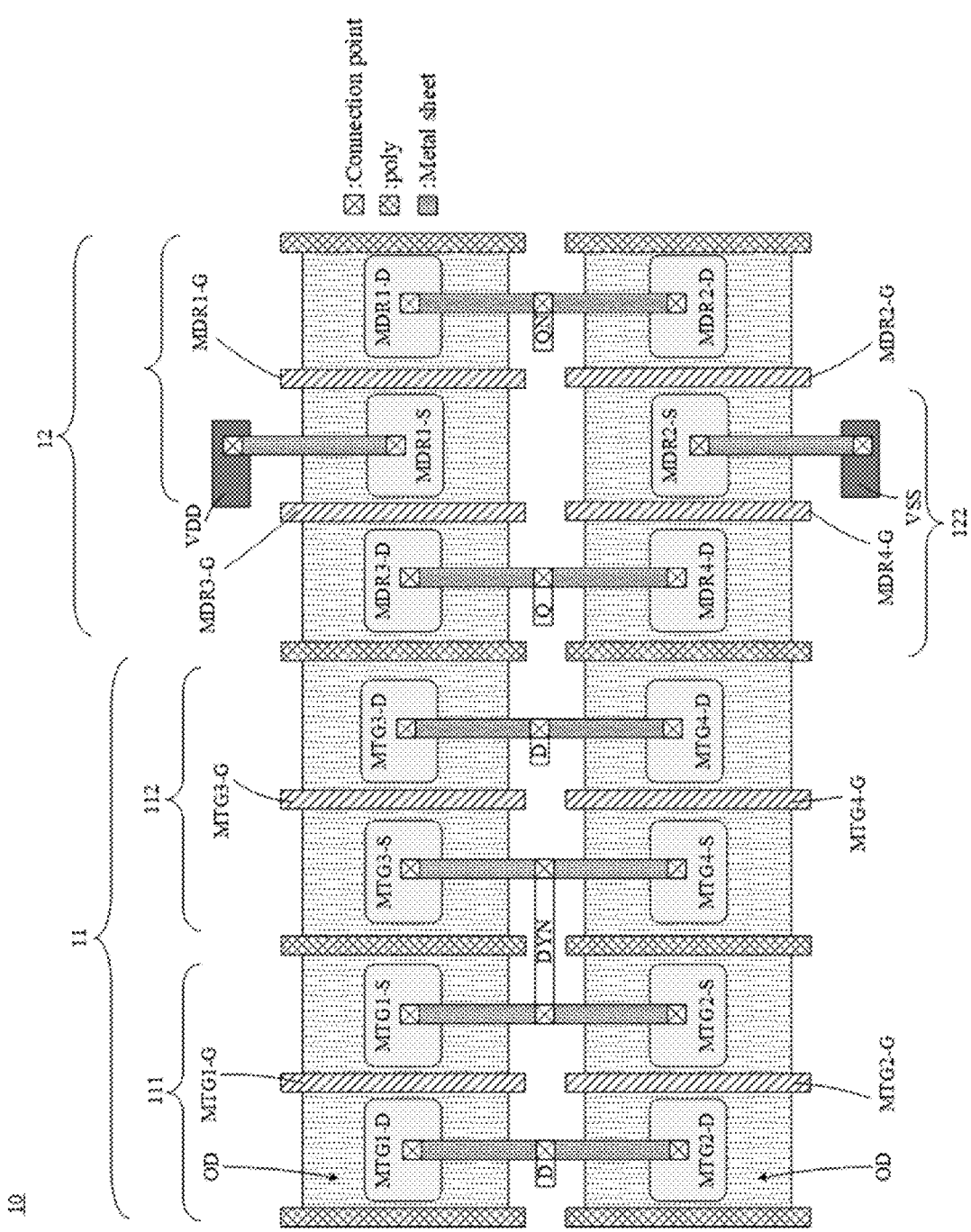
FIG. 8 is a structure diagram of a dynamic latch provided by another embodiment of the present application.

Please refer to FIG. 8 in combination with the above embodiments, and FIG. 8 is a structure diagram of a dynamic latch 10 provided by another embodiment of the present application.

In some embodiments, the first inverter 121 and the second inverter 122 share a same source region (MDR1-S, MDR2-S in the figure); the shared source region (MDR1-S, MDR2-S in the figure) is located between drain regions (MDR1-D, MDR2-D) of the first inverter 121 and the drain regions (MDR3-D, MDR4-D) of the second inverter 122.

It can be understood that, in combination with FIG. 4 and FIG. 8, the shared source region shown in FIG. 8 applies the same source region (MDR1-S, MDR2-S in the figure) of the first inverter 121; and in some other embodiments, the source region (e.g. MDR3-S, MDR4-S in FIG. 7) of the second inverter 122 can be applied to achieve the same effect, which will not be elaborated repeatedly here.

For example, in a chip design corresponding to the dynamic latch 10, the second inverter 122 can be set to be located in the second region B, and for the sake of reducing a chip size, the second inverter 122 and the first inverter 121 can share one source region (MDR1-S, MDR2-S in the figure).

For example, the shared source region (MDR1-S, MDR2-S) can be located between the drain region (MDR1-D, MDR2-D) of the first inverter 121 and the drain region (MDR5-D, MDR6-D) of the second inverter 122, so as to reduce the manufacturing difficulty of a chip corresponding to the dynamic latch 10.

Figure 9:
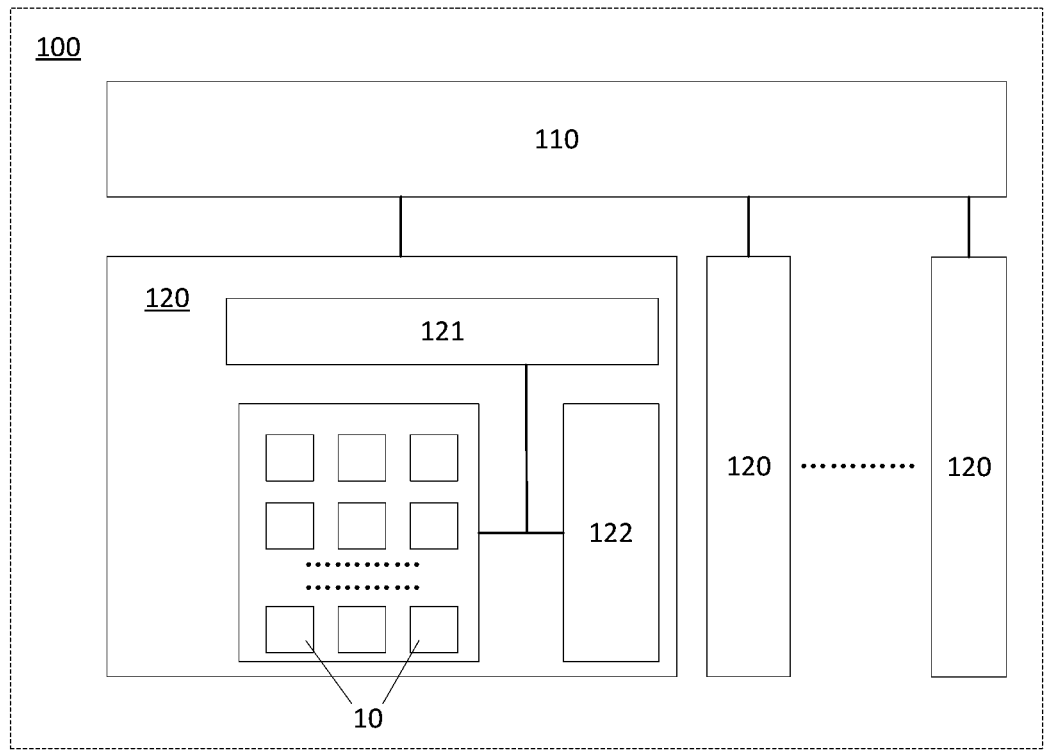
FIG. 9 is a structure diagram of a semiconductor chip provided by an embodiment of the present application.

Please refer to FIG. 9, which is a structure diagram of a semiconductor chip 100 provided by an embodiment of the present application.

The present application also provides the semiconductor chip 100, where the semiconductor chip 100 includes one or more dynamic latches 10 as provided in the above embodiments.

As shown in FIG. 9, the semiconductor chip 100 further includes a control unit 110, one or more data computing units 120, where the data computing unit 120 includes a control circuit 121, a computing circuit 122, and one or more dynamic latches 10. The control circuit 121 is connected to the dynamic latches 10 and the computing circuit 122, and the control circuit 121 is used to update data in the dynamic latches 10, and obtain the data from the dynamic latches 10; the computing circuit 122 can perform computations on the obtained data and output to the control circuit 121 for output.

Figure 10:
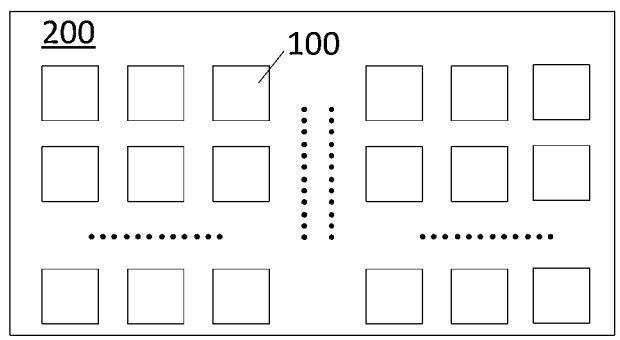
FIG. 10 is a structure diagram of a computing power board provided by an embodiment of the present application.

Please refer to FIG. 10, which is a structure diagram of a computing power board 200 provided by an embodiment of the present application.

As shown in FIG. 10, the computing power board 200 includes one or more installation parts of a semiconductor chip 100, and at least one of the installation parts is equipped with the semiconductor chip 100 to complete data computations.

Figure 11:
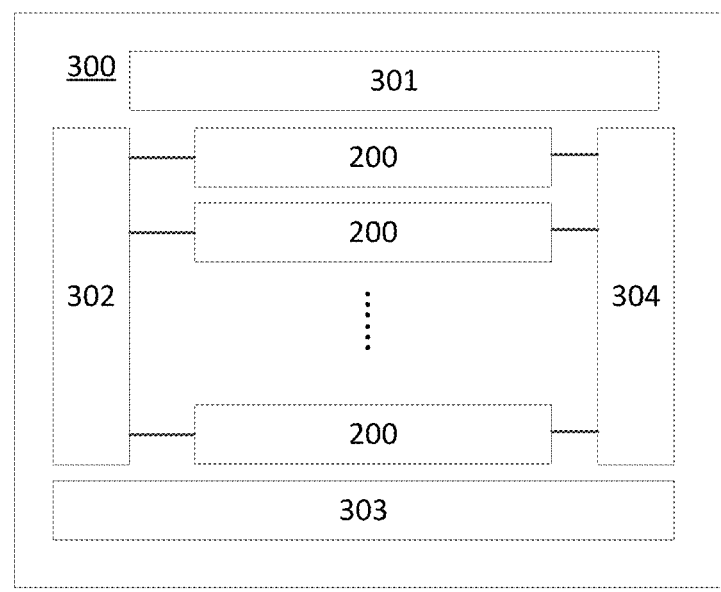
FIG. 11 is a structure diagram of a computing device provided by an embodiment of the present application.

Please refer to FIG. 11, which is a structure diagram of a computing device 300 provided by an embodiment of the present application.

The computing device 300 includes a power board 301, a connection board 302, a heat sink 303, a control board 304, and multiple computing power boards 200. The power board 301 is respectively connected to the connection board 302, the control board 304, the heat sink 303, and respective computing power boards 200. The control board 304 is connected to the computing power boards 200 through the connection board 302, and the heat sink 303 is set close to the computing power boards 200.

The above are only specific implementations of the present application, but a protection scope of the present application is not limited to this. Any skilled person familiar with the technical field can easily think of various equivalent modifications or replacements within a technical scope disclosed in the present application, which should be covered by the protection scope of the present application. Therefore, the protection scope of the present application should be subject to the protection scope of claims

What is claimed is:

1. A dynamic latch, comprising:
    a substrate;
    a data transmission unit, which is located in a first region of the substrate and comprises a first transmission gate and a second transmission gate, wherein an input end of the first transmission gate is connected to an input end of the second transmission gate, and an output end of the first transmission gate is connected to an output end of the second transmission gate;
    a data output unit, which is located in a second region of the substrate and comprises a first inverter, wherein an input end of the first inverter is connected to output ends of the two transmission gates; the first region is adjacent to the second region, and oxide diffusion regions in the two regions are continuous;
    wherein, drain regions of the two transmission gates are respectively located on opposite sides within the first region, and source regions of the two transmission gates are located between the drain regions of the two transmission gates.

2. The dynamic latch according to claim 1, wherein the first transmission gate and the second transmission gate share a source region; the shared source region is located between the drain region of the first transmission gate and the drain region of the second transmission gate.

3. The dynamic latch according to claim 1, wherein each of the two transmission gates includes a first clock signal input end and a second clock signal input end;
    wherein the first clock signal input ends of the two transmission gates are connected to a same first clock signal, and the second clock signal input ends of the two transmission gates are connected to a same second clock signal; wherein, the first clock signal and the second clock signal are signals in opposite phase to each other.

4. The dynamic latch according to claim 1, wherein a drain region of the first inverter is located on a side near the first region within the second region, and a source region of the first inverter is located on a side far away from the first region within the second region.

5. The dynamic latch according to claim 1, wherein the data output unit further comprises a second inverter; an input end of the second inverter is connected to an output end of the first inverter.

6. The dynamic latch according to claim 5, wherein drain regions of the two inverters are respectively located on opposite sides within the second region, and source regions of the two inverters are located between the drain regions of the two inverters.

7. The dynamic latch according to claim 6, wherein the first inverter and the second inverter share a same source region; the shared source region is located between the drain region of the first inverter and the drain region of the second inverter.

8. The dynamic latch according to claim 5, wherein source of a PMOS transistor in the first inverter and source of a PMOS transistor in the second inverter are connected to a same voltage drain drain; source of a NMOS transistor in the first inverter and source of a NMOS transistor in the second inverter are connected to a same voltage source source.

9. A semiconductor chip, comprising one or more dynamic latches according to claim 1.

10. The semiconductor chip according to claim 9, wherein the first transmission gate and the second transmission gate share a source region; the shared source region is located between the drain region of the first transmission gate and the drain region of the second transmission gate.

11. The semiconductor chip according to claim 9, wherein each of the two transmission gates includes a first clock signal input end and a second clock signal input end;
    wherein the first clock signal input ends of the two transmission gates are connected to a same first clock signal, and the second clock signal input ends of the two transmission gates are connected to a same second clock signal; wherein, the first clock signal and the second clock signal are signals in opposite phase to each other.

12. The semiconductor chip according to claim 9, wherein a drain region of the first inverter is located on a side near the first region within the second region, and a source region of the first inverter is located on a side far away from the first region within the second region.

13. The semiconductor chip according to claim 9, wherein the data output unit further comprises a second inverter; an input end of the second inverter is connected to an output end of the first inverter.

14. The semiconductor chip according to claim 13, wherein drain regions of the two inverters are respectively located on opposite sides within the second region, and source regions of the two inverters are located between the drain regions of the two inverters.

15. The semiconductor chip according to claim 14, wherein the first inverter and the second inverter share a same source region; the shared source region is located between the drain region of the first inverter and the drain region of the second inverter.

16. The semiconductor chip according to claim 15, wherein source of a PMOS transistor in the first inverter and source of a PMOS transistor in the second inverter are connected to a same voltage drain drain; source of a NMOS transistor in the first inverter and source of a NMOS transistor in the second inverter are connected to a same voltage source source.

17. A computing power board, comprising one or more semiconductor chips according to claim 9.

18. A computing device, comprising: a power board, a control board, a connection board, a heat sink, and multiple computing power boards according to claim 17; wherein the power board is connected to the control board, the connection board, the heat sink, and respective computing power boards; and the control board is connected to the computing power boards through the connection board, and the heat sink is set near the computing power boards.

* * * * *